(12) United States Patent
Uya (10) Patent No.: US 8,063,959 B2
(45) Date of Patent: Nov. 22, 2011

(54) BACKSIDE ILLUMINATION IMAGE PICKUP DEVICE, METHOD OF PRODUCING BACKSIDE ILLUMINATION IMAGE PICKUP DEVICE, AND SEMICONDUCTOR SUBSTRATE FOR BACKSIDE ILLUMINATION IMAGE PICKUP DEVICE

(75) Inventor: Shinji Uya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 616 days.

(21) Appl. No.: 12/126,603

(22) Filed: May 23, 2008

(65) Prior Publication Data

US 2008/0297634 A1 Dec. 4, 2008

(30) Foreign Application Priority Data

May 31, 2007 (JP) ................................ P2007-144816

(51) Int. Cl.
*H04N 3/14* (2006.01)
(52) U.S. Cl. ............. 348/294; 257/291; 438/57; 438/64
(58) Field of Classification Search .................. None
See application file for complete search history.

(56) References Cited

U.S. PATENT DOCUMENTS

| 5,828,088 | A | 10/1998 | Mauk |
| 7,101,726 | B2 | 9/2006 | Yamamoto et al. |
| 7,132,702 | B2 * | 11/2006 | Narui et al. ................... 257/228 |
| 7,153,720 | B2 * | 12/2006 | Augusto ........................ 438/69 |
| 2001/0032987 | A1 * | 10/2001 | Narui et al. ................... 257/225 |
| 2001/0054723 | A1 * | 12/2001 | Narui et al. ................... 257/228 |
| 2004/0007722 | A1 * | 1/2004 | Narui et al. ................... 257/228 |
| 2006/0180885 | A1 * | 8/2006 | Rhodes ........................ 257/432 |
| 2007/0117254 | A1 * | 5/2007 | Pain ............................. 438/75 |
| 2009/0020838 | A1 * | 1/2009 | Lin et al. ..................... 257/432 |

FOREIGN PATENT DOCUMENTS

| JP | 3722367 B2 | 9/2003 |
| JP | 2005150463 A | 6/2005 |

OTHER PUBLICATIONS

ITE Technical Report (Mar. 2006) vol. 30, No. 25, pp. 25-28 "Rimen Shosya CMOS Image Sensor" with English abstract.

* cited by examiner

*Primary Examiner* — David Ometz
*Assistant Examiner* — Angel L Garces-Rivera
(74) *Attorney, Agent, or Firm* — Birch, Stewart, Kolasch & Birch, LLP (57) ABSTRACT

An image pickup device including a semiconductor substrate that is irradiated with light from a first surface side thereof, and reading signal charges generated in the semiconductor substrate in accordance with the light from a second surface side thereof, wherein the semiconductor substrate includes: a photoelectric converting layer that includes a plurality of impurity diffusion layers on the second surface side of the semiconductor substrate, and that produces the signal charges by photoelectric conversion; and an embedded member that includes a light blocking material, and that is embedded in an impurity diffusion layer on a surface side of the photoelectric converting layer, the surface side facing the second surface side of the semiconductor substrate.

15 Claims, 6 Drawing Sheets

BACKSIDE ILLUMINATION IMAGE PICKUP DEVICE, METHOD OF PRODUCING BACKSIDE ILLUMINATION IMAGE PICKUP DEVICE, AND SEMICONDUCTOR SUBSTRATE FOR BACKSIDE ILLUMINATION IMAGE PICKUP DEVICE

BACKGROUND OF THE INVENTION

1. Field of the Invention

The present invention relates to an image pickup device which photoelectrically converts incident light to produce signal charges, and more particularly to an image pickup device in which color mixture can be reduced, a method of producing such an image pickup device, and a semiconductor substrate for such an image pickup device.

2. Background Art

As shown in ITE Technical Report vol. 30, No. 25, pp. 25-28 "Rimen Shosya CMbS Image Sensor," U.S. Pat. No. 5,828,088, Japanese Patent No. 3,722,367 and JP-A-2005-150463 (the term "JP-A" as used herein means an "unexamined published Japanese patent application"), a solid-state image pickup device of the backside illumination type, which has been used only in a specific application field where emphasis is placed on the quantum efficiency or the aperture ratio, has been proposed to be used in a consumer image pickup device such as a digital camera or a digital video camera.

The greatest feature of a backside illumination image pickup device is that the optical sensitivity can be improved by increasing the quantum efficiency. This is because, unlike the surface incident configuration, the rear face incident configuration has no structure for blocking incident light, on the light incident side, so that the aperture ratio can be increased, and a photoelectric converting portion can be designed to be sufficiently thick, whereby substantially 100% of incident light can be photoelectrically converted.

Figure 8:
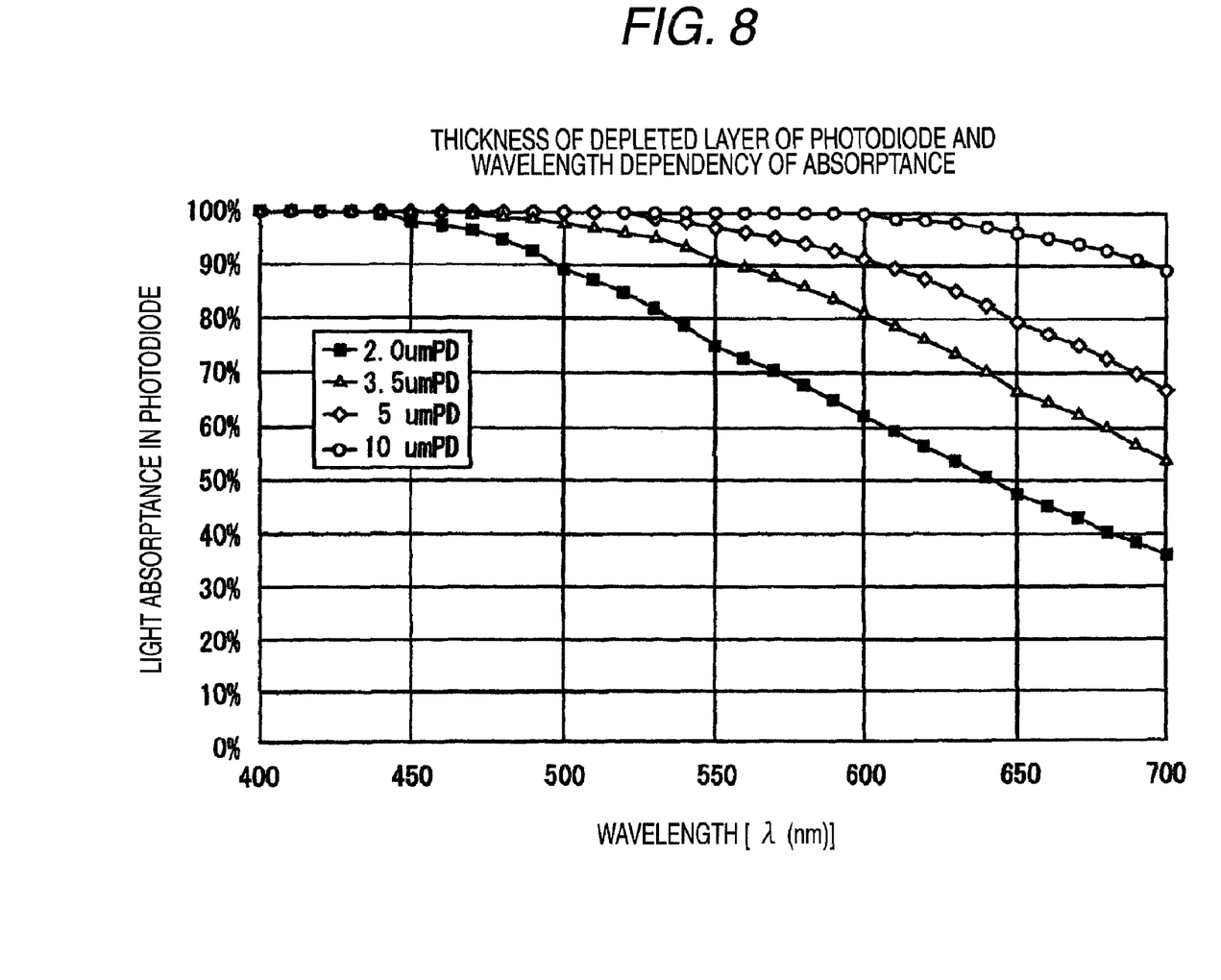
FIG. 8 is a graph showing the absorptance to the wavelength of incident light with respect to various thicknesses of a depleted layer of a photodiode which performs photoelectric conversion.

FIG. 8 is a graph showing the absorptance to the wavelength of incident light with respect to various thicknesses of a depleted layer of a photodiode which performs photoelectric conversion. As shown in FIG. 8, in a photodiode in which the depleted layer has a thickness of 2.0 µm, 3.5 µm, or 5 µm, the light absorptance in the photodiode is more reduced as the wavelength is longer. Therefore, it is seen that, when the thickness of the depleted layer of a photodiode is set to 10 µm, the reduction of the absorptance depending on the wavelength of incident light can be suppressed. In this way, when the thickness of the photodiode is increased, the reduction of the absorptance of incident light can be suppressed, and the optical sensitivity can be improved.

In the case where the thickness of a photoelectric converting layer is made large, there arise the following problems when an image pickup device is produced.

(1) In a photoelectric converting layer, impurity diffusion layers of different impurity concentrations are formed by an ion implanting apparatus. When the photoelectric converting layer is thick, the apparatus has a limit to implant ions to a sufficient depth.

(2) In implantation of ions, when the ions are implanted to a deep region of the photoelectric converting layer, the range where the ions are implanted is wider as the depth is larger. Therefore, it is difficult to adequately form element separation for respective pixels.

(3) In a production process in which optical elements are overlaid on a face of the photoelectric converting layer on the light incident side, and that on the side of a wiring board for transferring signal charges, a high overlay accuracy is required.

In a conventional backside illumination image pickup device, when a photoelectric converting portion is designed to be thick, therefore, there is a fear that color mixture is notably caused by so-called pixel crosstalk in which incident light enters photodiodes of adjacent pixels to generate signal charges.

In Non-patent Reference 1 above, a photodiode of the backside illumination CMOS sensor has a thickness of 4.0 µm, and the thickness is approximately equal to that of a conventional image pickup device. Therefore, the sensor does not employ the configuration which is an advantage of a backside illumination image pickup device, and in which a photoelectric converting layer can be made sufficiently thick, and hence pixel miniaturization by improving the optical sensitivity cannot be attained. At present, an image sensor having a pixel size of 2 µm square is commercially produced, and the development of a pixel of a smaller size is advancing. A request for a backside illumination image pickup device in which a minute pixel having a size of 1.4 to 1.6 µm square can be realized is increasing. In the configuration of an image pickup device in which the pixel size is smaller than about 1.5 µm and a silicon layer having a photoelectric converting layer of a thickness of 10 µm or more is disposed, the ratio of the width and thickness of the photoelectric converting layer of each pixel is 1:6 or larger. Usually, it is known that, when the thickness ratio is larger than 1, color mixture caused by crosstalk easily occurs. Non-patent Reference 1 above relates to the configuration where the thickness of the photoelectric converting layer is not increased, and which cannot solve the problem that color mixture occurs more easily as the ratio of the thickness to width of the photoelectric converting layer becomes larger.

SUMMARY OF THE INVENTION

The invention has been conducted in view of the above-discussed circumstances. It is an object of the invention to provide an image pickup device in which a photoelectric converting portion can be made thick, the optical sensitivity can be improved, and occurrence of color mixture can be suppressed, a method of producing the image pickup device, and a semiconductor substrate for the image pickup device.

The object of the invention can be achieved by the following configurations.

(1) According to a first aspect of the present invention, An image pickup device comprising a semiconductor substrate that is irradiated with light from a first surface side thereof, and taking an image by reading signal charges generated in the semiconductor substrate in accordance with the light from a second surface side thereof, wherein the semiconductor substrate includes: a photoelectric converting layer that includes a plurality of impurity diffusion layers on the second surface side of the semiconductor substrate, and that produces the signal charges by photoelectric conversion; and an embedded member that includes a light blocking material, and that is embedded in an impurity diffusion layer on a surface side of the photoelectric converting layer to which the light irradiated on the first surface side of the semiconductor substrate is entered.

(2) The image pickup device as described in the item (1), wherein the embedded member includes a plurality of light blocking members that are placed in boundaries of adjacent pixels.

(3) The image pickup device as described in the item (2), wherein the photoelectric converting layer includes a pixel separation region that is formed in the boundaries of the adjacent pixels, and the light blocking members are formed adjoining the pixel separation region.

(4) The image pickup device as described in the item (2) or (3), wherein outer circumferences of the light blocking members are covered by an insulating material.

(5) The image pickup device as described in the item (4), wherein a negative voltage is applied to the light blocking members.

(6) The image pickup device as described in the item (4) or (5), wherein the insulating material includes one of an insulating film that is formed by performing a heat treatment on a light blocking member made of a metal material, and a silicide oxide film of a metal material.

(7) The image pickup device as described in the item (2) or (3), wherein the light blocking members are covered by a non-depleted layer of the impurity diffusion layers.

(8) The image pickup device as described in the item (7), wherein the light blocking members are grounded.

(9) The image pickup device as described in any one of the items (1) to (8), wherein the embedded member is formed in at least one of the first surface side and the second surface side of the semiconductor substrate, and includes an alignment mark that is used as a positional reference of an optical element to be disposed on the semiconductor substrate, during production of the image pickup device.

(10) The image pickup device as described in any one of the items (1) to (9), wherein the semiconductor substrate includes a color filter layer that includes a plurality of color filters transmitting light of different wavelengths, respectively, and that is formed on the first surface side thereof.

(11) The image pickup device as described in any one of the items (1) to (10), wherein the semiconductor substrate includes: an oxide film; and an antireflection film, the oxide film and the antireflection film being formed on the first surface side of the semiconductor substrate, and one of the oxide film and the antireflection film includes a light blocking film that is placed in boundaries of adjacent pixels outer circumference thereof.

(12) The image pickup device as described in any one of the items (1) to (11), having a ratio of a thickness of the photoelectric converting layer to a pixel size thereof, the ratio being 4 or more.

(13) The image pickup device as described in any one of the items (1) to (12), wherein the pixel size is 2 μm square or less.

(14) The image pickup device as described in any one of the items (1) to (13), wherein the photoelectric converting layer has a thickness of 8 μm or more.

(15) According to a second aspect of the present invention, a method of producing an image pickup device including a semiconductor substrate that is irradiated with light from a rear side thereof, and taking an image by reading signal charges generated in the semiconductor substrate in accordance with the light from a surface side thereof, the method including: pattern-forming a first alignment mark on a first surface side of a silicon layer; forming an epitaxial layer on the silicon layer by epitaxial growth; pattern-forming a second alignment mark on the first surface of the epitaxial layer by using the first alignment mark as a reference; forming a sensor region that includes a plurality of impurity diffusion layers in the epitaxial layer; and bonding a supporting substrate to the surface side of the epitaxial layer, wherein the forming of the sensor region includes positioning the sensor region by using the second alignment mark as a reference.

(16) The method as described in the item (15), wherein the epitaxial growth is performed by using a method of Epitaxial Lateral Overgrowth.

(17) The method as described in the item (15) or (16), wherein the forming of the first alignment mark includes forming a plurality of light blocking members in boundaries of adjacent pixels by using a material that is identical with a material of the first alignment mark, and that has a light blocking property.

(18) The method as described in any one of the items (15) to (17) further including: forming an oxide film and an antireflection film on a second surface side of the epitaxial layer; and forming a light blocking film that is placed in the boundaries of the adjacent pixels, outside one of the oxide film and the antireflection film.

(19) The method as described in any one of the items (15) to (18), further including: forming an oxide film and an antireflection film on the second surface side of the epitaxial layer; forming a third alignment mark outside one of the oxide film and the antireflection film; forming a color filter layer having plural color filters which transmit light of different wavelengths, respectively, on the second surface side of the epitaxial layer; and positioning the color filter layer by using the third alignment mark as a reference.

(20) The method as described in the item (17), further including: forming a pixel separation region in the boundaries of the adjacent pixels so that each of the light blocking members and the pixel separation region are contacted with each other.

(21) The method as described in any one of the items (17) to (20), wherein outer circumferences of the light blocking members are covered by an insulating material.

(22) The method as described in the item (21), wherein the insulating material includes one of an insulating film that is formed by performing a heat treatment on a light blocking member made of a metal material, and a silicide oxide film of a metal material.

(23) The method as described in the item (17), wherein the light blocking members are covered by a non-depleted layer of the epitaxial layer.

(24) According to a third aspect of the present invention, a semiconductor substrate for an image pickup device including a semiconductor substrate that is irradiated with light from a first surface side thereof, and taking an image by reading signal charges generated in the semiconductor substrate in accordance with the light from a second surface side thereof, the semiconductor substrate including: a photoelectric converting layer that includes a plurality of impurity diffusion layers on the first surface side of the semiconductor substrate, and that produces the signal charges by photoelectric conversion; and an embedded member that includes a light blocking material, and that is embedded in an impurity diffusion layer on a surface side of the photoelectric converting layer, the surface side facing the second surface side of the semiconductor substrate.

The image pickup device of the invention has the configuration in which an embedded member made of a light blocking material is disposed in a photoelectric converting layer. The embedded member can be embedded in an active layer in the photoelectric converting layer by the ELO (Epitaxial Lateral Overgrowth) method.

According to the configuration, the embedded member may be configured as a light blocking member for suppressing crosstalk in a boundary between adjacent pixels, whereby occurrence of color mixture can be suppressed. Furthermore, the embedded member may be configured as an alignment mark which is used as a reference in positioning of optical elements, color filter layers, and microlenses that are formed in predetermined placement relationships with respect to the photoelectric converting layer. Therefore, the positioning accuracy can be improved, and occurrence of color mixture due to misalignment caused in positioning can be suppressed. Both a light blocking member and an alignment mark are configured by the same embedded member, whereby occurrence of color mixture can be suppressed more surely.

In the configuration of the image pickup device, preferably, the outer sides of the light blocking members are covered by an insulative material. According to the configuration, in the case where the light blocking members are configured by a conductive material such as metal material, electron injection can be prevented from occurring by the embedding of the light blocking members. A configuration in which the light blocking members are covered by a non-depleted layer of the plural impurity diffusion layers may be formed.

In the configuration of the image pickup device, preferably, a negative voltage is applied to the light blocking members. According to the configuration, in the case where the photoelectric converting layer is configured by silicon, a phenomenon that charges generated in an interface of an insulating film enter mixed as a dark current with the signal charges can be prevented from occurring.

In the method of producing an image pickup device of the invention, an epitaxial layer is formed on a silicon layer by epitaxial growth, and thereafter a sensor region is formed on the surface side of the epitaxial layer, thereby obtaining a photoelectric converting layer. In this case, before the epitaxial layer is formed, a first alignment mark is formed on the surface of the silicon layer, and, after the epitaxial layer is formed, a second alignment mark is formed on the surface of the epitaxial layer with using the first alignment mark as a reference. During the formation of the sensor region, positioning is performed with using the second alignment mark as a reference. In the case where the second alignment mark is formed with using the first alignment mark on the surface of the epitaxial layer as a reference, the positioning accuracy is lowered by the thickness of the epitaxial layer, but a high positioning accuracy is not requested in the position of the second alignment mark with respect to the first alignment mark, and therefore this is not problematic. In the case where the sensor region is formed on the surface of the epitaxial layer, positioning is performed with using the second alignment mark formed on the surface as a reference, and therefore reduction of the detection accuracy caused by the thickness of the epitaxial layer is small, so that the positioning can be performed with a high accuracy. According to the configuration, in the case where the thickness of a photoelectric converting layer is made large, when, during alignment, an alignment mark formed in one face is detected from the opposite face by detection light such as infrared light, reduction of the detection accuracy according to the thickness can be prevented from occurring. Even when the photoelectric converting layer is thickened, therefore, positioning can be performed with a high accuracy, and occurrence of color mixture due to misalignment can be suppressed.

According to the invention, it is possible to provide an image pickup device in which a photoelectric converting portion can be made thick, the optical sensitivity can be improved, and occurrence of color mixture can be suppressed, a method of producing the image pickup device, and a semiconductor substrate for the image pickup device.

BRIEF DESCRIPTION OF THE DRAWINGS

The invention disclosed herein will be understood better with reference to the following drawings of which.

DETAILED DESCRIPTION OF THE INVENTION

Hereinafter, embodiments of the invention will be described with reference to the accompanying drawings.

First, a method of producing the image pickup device of the invention will be described with reference to the drawings. In the image pickup device, an image is taken while the rear face side of a semiconductor substrate is irradiated with light, and signal charges that are generated in the semiconductor substrate in accordance with the light are read from the surface side of the semiconductor substrate.

Figure 1A:
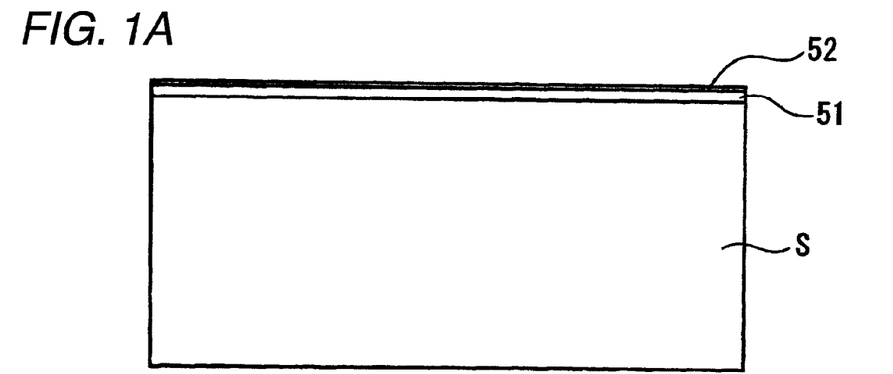
FIGS. 1A to 1C are diagrams illustrating a procedure of producing an image pickup device.

FIGS. 1A to 4 are views illustrating procedures of the method of producing the image pickup device. As shown in FIG. 1A, initially, a silicon substrate S, and a silicon oxide film ($SiO_2$) 51 on the surface of the silicon substrate S are formed. A silicon layer 52 which functions as a seed layer for epitaxial growth is formed on the silicon oxide film 51. A semiconductor wafer of the SOI (Silicon on Insulator) structure having the silicon oxide film 51 and the silicon layer 52 may be previously prepared. The silicon oxide film ($SiO_2$) 51 may be replaced with another insulating film.

Figure 1B:
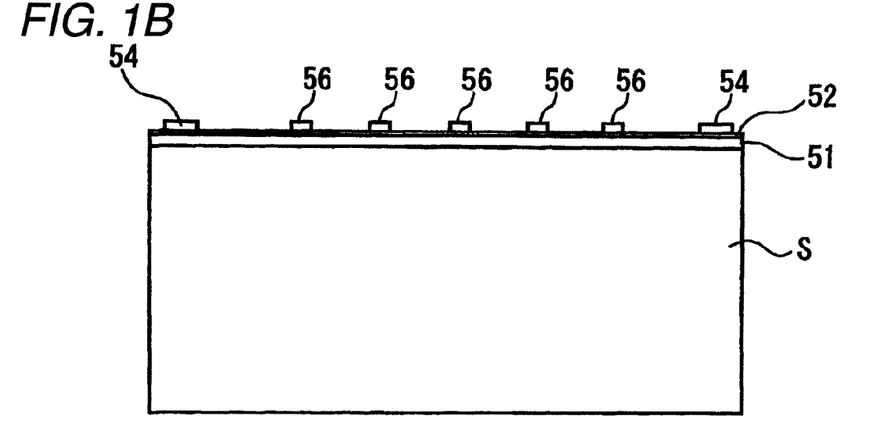

As shown in FIG. 1B, by using a light blocking material, alignment marks (in the embodiment, functioning as a first alignment mark) 54 and light blocking members 56 are pattern-formed on the surface of the silicon layer 52. The alignment marks 54 and the light blocking members 56 may be collectively pattern-formed as the same layer by using the same light blocking material and the same mask. The alignment marks 54 and the light blocking members 56 may be formed by a method in which, after a resist pattern is formed by a photolithography process, a light blocking material is vapor-deposited, and then the photoresist is peeled to perform lift-off. In this case, the silicon layer 52 incurs no etching damage.

Figure 1C:
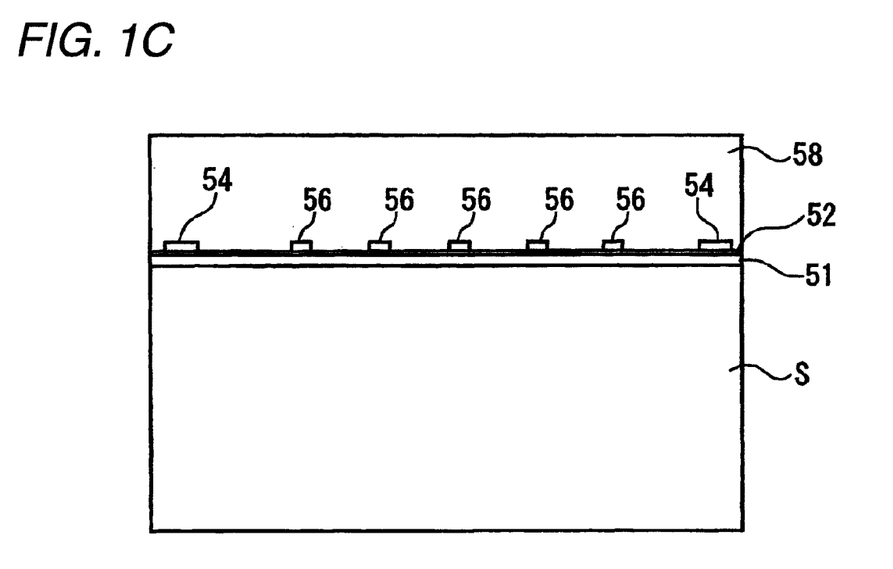

As shown in FIG. 1C, epitaxial growth is performed by the Epitaxial Lateral Overgrowth (ELO) method to form an epitaxial layer 58 on the silicon layer 52. As a result, the alignment marks 54 and light blocking members 56 which are formed on the surface of the silicon layer 52 can be embedded in the epitaxial layer 58. In this specification, the alignment marks 54 and the light blocking members 56 are often generally referred to as an embedded member.

Figure 2A:
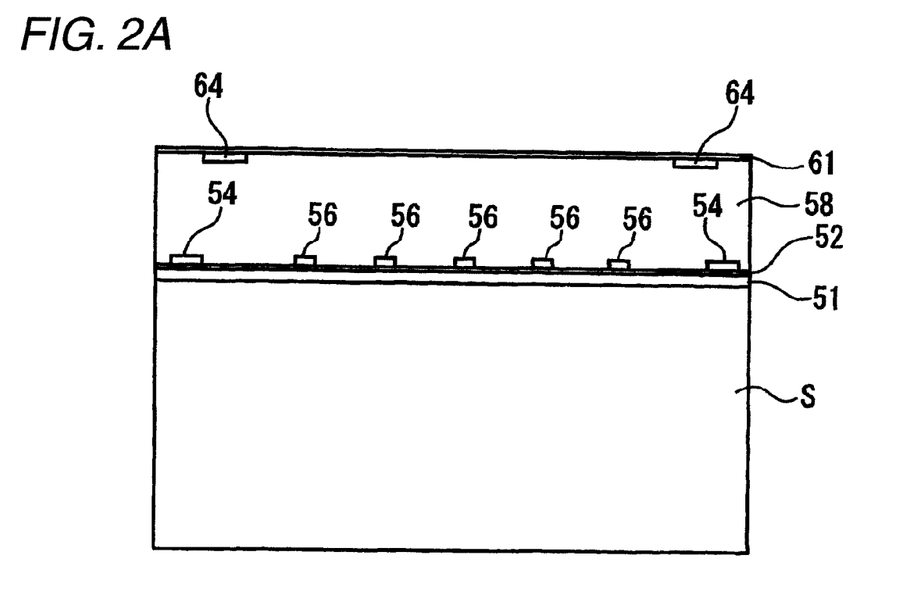
FIGS. 2A and 2B are diagrams illustrating a procedure of producing the image pickup device.

As shown in FIG. 2A, second alignment marks 64 are formed in the surface of the epitaxial layer 58. The second alignment marks 64 are formed in the following manner. The first alignment marks 54 formed on the rear face side of the epitaxial layer 58 is detected from the surface side of the epitaxial layer 58 with using an exposure apparatus having an alignment function using infrared light. The second alignment marks 64 are formed with using the detected positions of the first alignment marks 54 by the LOCOS (Local Oxidation of Silicon) method or the STI (Shallow Trench Isolation) method. The second alignment marks 64 may be formed by using a material having the same light blocking property as the first alignment marks 54.

After the second alignment marks 64 are formed, an insulating film 61 is formed on the surface of the epitaxial layer 58 by the CVD (Chemical Vapor Deposition) method or the like.

Figure 2B:
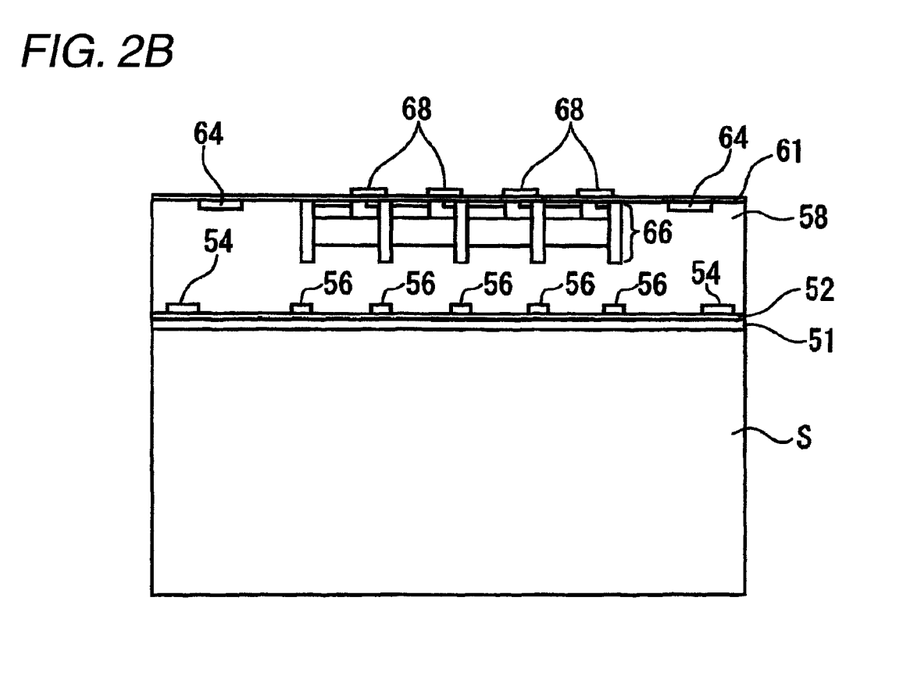

As shown in FIG. 2B, a sensor region 66 is formed while the region is positioned with using the second alignment marks 64 formed in the surface of the epitaxial layer 58 as a reference. In the embodiment, the configuration including charge transfer electrodes 68 of the CCD image sensor type is used as an example. However, the type of the transfer electrodes is not restricted to this, and a configuration of the COS image sensor type may be used.

Figure 3A:
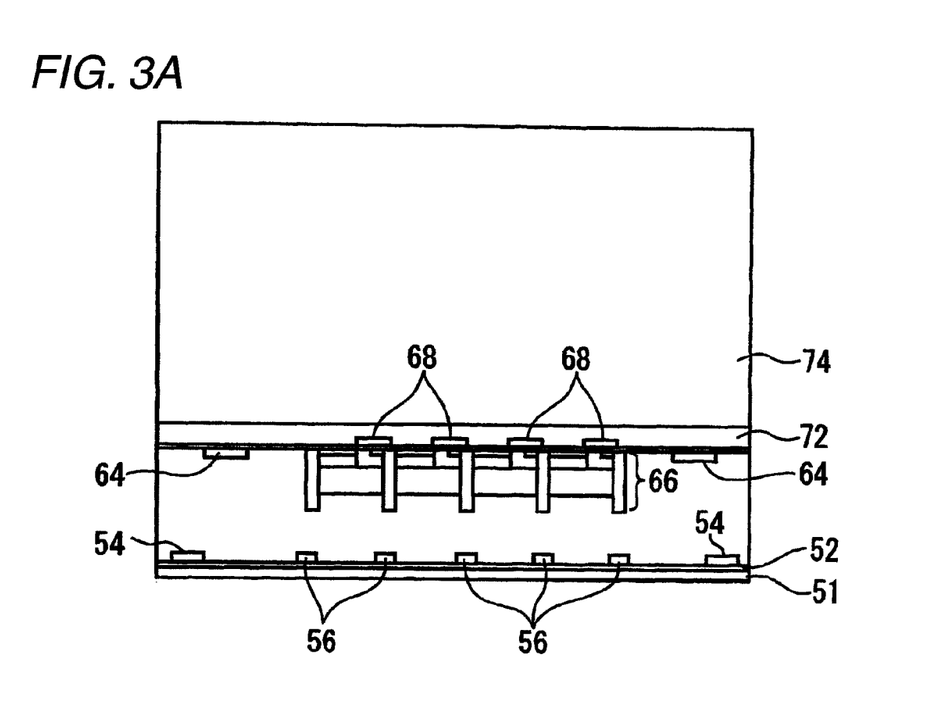
FIGS. 3A and 3B are diagrams illustrating a procedure of producing the image pickup device.

As shown in FIG. 3A, a transparent adhesive agent 72 is applied to the insulating film 61 on the surface side of the epitaxial layer 58, and a supporting substrate 74 is bonded.

The SOI silicon substrate S which is stacked on the rear face of the epitaxial layer 58 is removed by etching using potassium hydroxide (KOH) or the like, and the silicon oxide film 51 is exposed from the rear face.

Figure 3B:
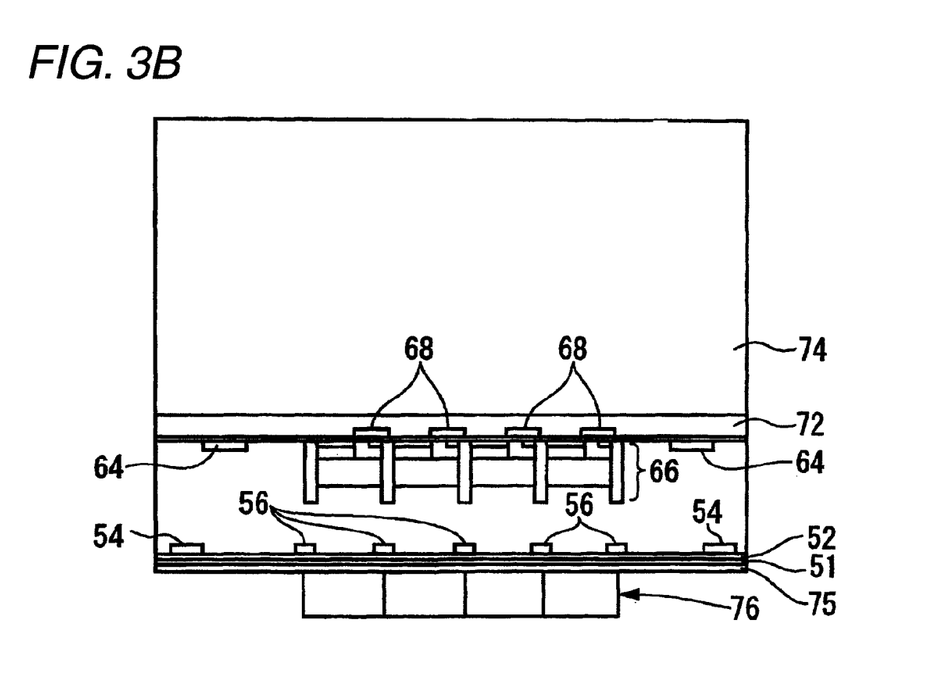

As shown in FIG. 3B, an antireflection film 75 is formed on the silicon oxide film 51 exposed from the rear face side of the epitaxial layer 58. A color filter layer 76 having plural color filters which transmit light of different wavelengths, respectively is formed on the antireflection film 75. In the color filter layer 76, filters of R (red), G (green), and B (blue) are disposed in a matrix in a state where the plural color filters are seen from the rear face side.

Figure 4:
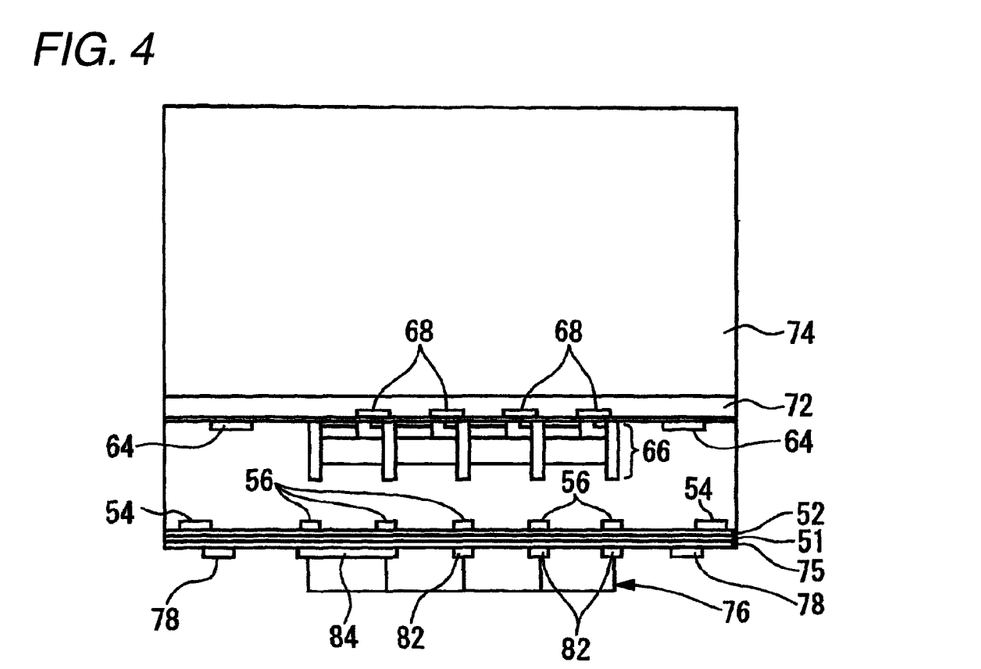
FIG. 4 is a diagram illustrating a procedure of producing the image pickup device.

As shown in FIG. 4, light blocking portions 82 may be formed on the antireflection film 75 by using a material having the same light blocking property as the light blocking members 56. In this case, the light blocking portions 82 are disposed in boundaries of adjacent pixels in the interface between the color filter layer 76 and the antireflection film 75.

Third alignment marks 78 may be formed on the antireflection film 75. The third alignment marks 78 may be configured by a single layer made of a material having the same light blocking property as the light blocking portions 82, and simultaneously pattern-formed with using one mask. Simultaneously with the light blocking portions 82, an optical black portion 84 for removing a DC component of a dark current based on the difference of signals of effective pixels may be formed. The light blocking portions 82 and the third alignment marks 78 may be formed on the silicon oxide film 51.

As a result of the above-described procedures, it is possible to produce a semiconductor substrate that is suitable for an image pickup device in which an image is taken while the rear face where an embedded member is embedded in an SOI substrate is irradiated with light, and signal charges generated in the substrate in accordance with the light are read from the surface side of the substrate.

According to the method of producing an image pickup device of the invention, the epitaxial layer 58 is formed on the silicon layer 52 by epitaxial growth, and thereafter the sensor region 66 is formed on the surface side of the epitaxial layer 58, thereby obtaining a photoelectric converting layer. In this case, before the epitaxial layer 58 is formed, the first alignment mark 54 is formed on the silicon layer 52, and, after the epitaxial layer 58 is formed, the second alignment mark 64 is formed on the surface of the epitaxial layer 58 with using the first alignment mark 54 as a reference. During the formation of the sensor region 66, positioning is performed with using the second alignment mark 64 as a reference. In the case where the second alignment marks 64 is formed with using the first alignment mark 54 in the surface of the epitaxial layer 58, the positioning accuracy is lowered by the thickness of the epitaxial layer 58, but a high positioning accuracy is not requested in the position of the second alignment mark 64 with respect to the first alignment mark 54, and therefore this is not problematic. In the case where the sensor region is formed on the surface of the epitaxial layer 58, positioning is performed with using the second alignment mark 64 formed on the surface as a reference, and therefore reduction of the detection accuracy caused by the thickness of the epitaxial layer 58 is small, so that the positioning can be performed with a high accuracy. According to the configuration, in the case where the thickness of the photoelectric converting layer is made large, when, during alignment, an alignment mark formed in one face is detected from the opposite face by detection light such as infrared light, reduction of the detection accuracy according to the thickness can be prevented from occurring. Even when the photoelectric converting layer is thickened, therefore, positioning can be performed with a high accuracy, and occurrence of color mixture due to misalignment can be suppressed.

Figure 5:
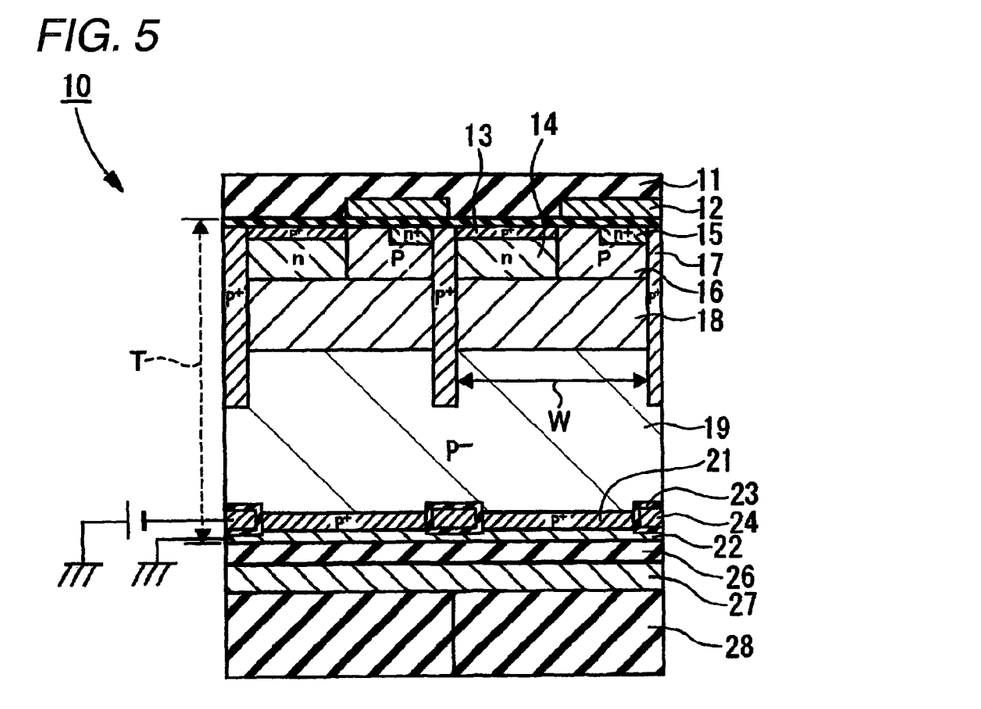
FIG. 5 is a section view showing the configuration of a first embodiment of the image pickup device of the invention.

Next, the configuration of a first embodiment of the image pickup device of the invention will be described. FIG. 5 is a section view showing the configuration of the image pickup device of the first embodiment. The image pickup device 10 includes a photoelectric converting layer which has plural stacked impurity diffusion layers, and which produces signal charges by photoelectric conversion. The upper face in the figure is referred to as "surface", and the lower face is referred to as "rear face".

The photoelectric converting layer has sequentially from the rear face side to the surface side: a silicon oxide film ($SiO_2$) 26; a silicon layer 22 which functions as a seed layer for epitaxial growth; light blocking members 24 which are formed on the surface of the silicon layer 22 and in boundaries of adjacent pixels; a high-concentration p+ type impurity diffusion layer 21 which is formed in a region where the light blocking members 24 are not disposed, on the surface of the silicon layer 22; and an epitaxial layer 19 which is formed so as to cover the impurity diffusion layer 21 and the light blocking members 24, and which is made of p− type silicon that is lower in impurity concentration than the impurity diffusion layer 21.

The light blocking members 24 are configured by, for example, a metal material. The outer sides of the members are covered by an insulating film 23 of an insulative material. In the embodiment, the insulating film 23 may be formed by applying a heat treatment on the light blocking members 24, or may be a silicide oxide film of a metal material.

The image pickup device 10 of the embodiment has a configuration in which a wiring circuit is disposed so that, during the driving process, a negative voltage is applied to the light blocking members 24, and the silicon layer 22 on the rear face side with respect to the light blocking members 24 is grounded. According to the configuration, in the case where the light blocking members 24 are configured by a conductive member made of a metal material or the like, generation of charges between the members and surrounding active layers can be prevented from occurring.

Although not shown in FIG. 5, alignment marks which are made of the same material as the light blocking members 24 may be formed on the surface side of the silicon layer 22.

In the photoelectric converting layer, n− type impurity diffusion layers 18 having a low impurity concentration are stacked in respective pixel regions on the surface of the epitaxial layer 19. Each of the n− type impurity diffusion layers 18 is separated from the layer of the adjacent pixel by an element separation region 17 which is formed by a p+ type impurity diffusion layer having a high impurity concentration. On the surface side of each of the n− type impurity diffusion layers 18, an n type impurity diffusion layer 14 and a p+ type impurity diffusion layer 13 having a high impurity concentration are stacked in a partial region of the pixel region, and a p type impurity diffusion layer 16 which is lower in impurity concentration than the p+ type impurity diffusion layer 13 is formed in the remaining region of the pixel region. The p type impurity diffusion layer 16 is formed in the same thickness as the stack of the impurity diffusion layer 14 and the p+ type impurity diffusion layer 13, and adjacent to the stack in the horizontal direction (the lateral direction in FIG. 5). A high-concentration n type impurity diffusion layer 15 is formed in a state where a part of the layer is exposed from the surface of the p type impurity diffusion layer 16.

On the surfaces of the p+ type impurity diffusion layer 13 and the p type impurity diffusion layer 16 (including the impurity diffusion layer 15 exposed from the p type impurity diffusion layer 16), an insulating layer 11 is formed through an insulating film which functions as a gate insulating film. The electrodes 12 for transferring the charges to vertical charge transfer portions (VCCDs) are formed on the rear faces of the insulating layer 11. In the embodiment, the structure for reading charges is configured as the CCD image sensor type. The reading structure is not particularly restricted to this as far as signal charges accumulated in the photoelectric converting layer are read and transferred. For example, the CMOS image sensor type may be employed. In the case of the CMOS image sensor type, a multi-layer wiring electrode is formed on the insulating layer 11.

An antireflection film 27 is formed through the silicon oxide film 26 on the rear face side of the photoelectric converting layer. On the rear face of the antireflection film 27, a color filter layer 28 is formed in which plural color filters that transmit light of different wavelengths, respectively are arranged in a matrix with respect to the rear face. Upward-convex microlenses which are bent so that the lens surface is projected toward the light incident side may be formed on the rear face of the color filter layer 28.

Preferably, the image pickup device 10 is configured so that the ratio of the thickness T of the photoelectric converting layer to the pixel size W is 4 or larger, or in other words T/W≧4. The pixel size W corresponds to the length (the lateral length in FIG. 5) of one side of the pixel region which is defined in a square shape as seen from the rear face side (or the surface side). Preferably, the pixel size is equal to or smaller than 2 μm square. According to the configuration, the photoelectric converting layer can be made thick to improve the optical sensitivity, and the pixels can be miniaturized.

In the image pickup device 10, during the driving process, light is incident from the rear face side of the photoelectric converting layer and transmitted through the color filter layer 28 to impinge on the interior of the photoelectric converting layer. When the incident light enters the photoelectric converting layer, signal charges are produced by photoelectric conversion. The produced signal charges are once accumulated in the impurity diffusion layer 14. When a read pulse is applied to the electrode 12 during the reading process, the accumulated signal charges are read out to the impurity diffusion layer 15 to be transferred. At this time, in the photoelectric converting layer, the light blocking members 24 are formed as an embedded member in boundaries of adjacent pixels, and hence it is possible to prevent light which is transmitted through the color filter layer 28 from entering surrounding pixel regions.

According to the configuration of the image pickup device 10 of the embodiment, the embedded member is configured as the light blocking member 24 for suppressing crosstalk in a boundary between adjacent pixels, whereby occurrence of color mixture can be suppressed. Moreover, the embedded member can be configured as an alignment mark which is used as a reference in positioning of the sensor region, color filter layer 28, and microlenses that are formed in predetermined placement relationships with respect to the photoelectric converting layer. Therefore, the positioning accuracy can be improved, and occurrence of color mixture due to misalignment caused in positioning can be suppressed. Both the light blocking member 24 and the alignment mark are configured by the same embedded member, whereby occurrence of color mixture can be suppressed more surely.

Figure 6:
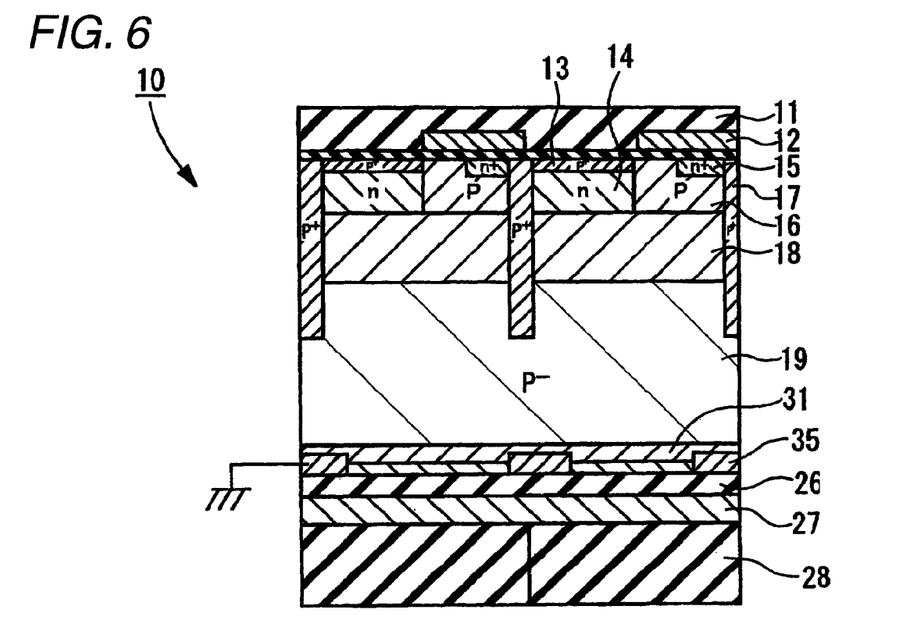
FIG. 6 is a section view showing the configuration of a second embodiment of the image pickup device of the invention.

FIG. 6 shows a second embodiment of the image pickup device of the invention. In the following description of embodiments, members and the like having a configuration and function which are equivalent to those of the members that have described above are denoted by the same or corresponding reference numerals in the figures, and the description thereof is simplified or omitted.

In the image pickup device 10 of the embodiment, the structure of light blocking members 35 which are formed as an embedded member on the silicon oxide film 26, and the configuration of an epitaxial layer in the periphery of the light blocking members 35 are different from those of the first embodiment. Hereinafter, different portions will be described.

As shown in FIG. 6, the light blocking members 35 made of a metal material or the like are formed in boundaries of adjacent pixels on the surface of the silicon oxide film 26. The light blocking members 35 are covered by a p+ type epitaxial layer 31 having a high impurity concentration. The layer covering the light blocking members 35 is not restricted to the epitaxial layer 31, and may be configured by another epitaxial layer or an impurity diffusion layer as far as it is a non-depleted layer which does not generate charges in boundaries to the light blocking members 35. The light blocking members 35 are connected to a grounding circuit so as to be fixed to 0 V during the driving process. According to the configuration, in the case where the light blocking members 35 are configured by a conductive material such as a metal material, it is not required to form an insulating film outside a metal material portion as in the configuration shown in FIG. 5, and generation of charges between the light blocking members 35 and surrounding active layers can be suppressed. Alternatively, a configuration where an insulating film is formed outside a metal material portion, and the light blocking members 35 are covered by a non-depleted layer may be employed. In the alternative, generation of charges between the light blocking members 35 and surrounding active layers can be suppressed more remarkably.

Figure 7:
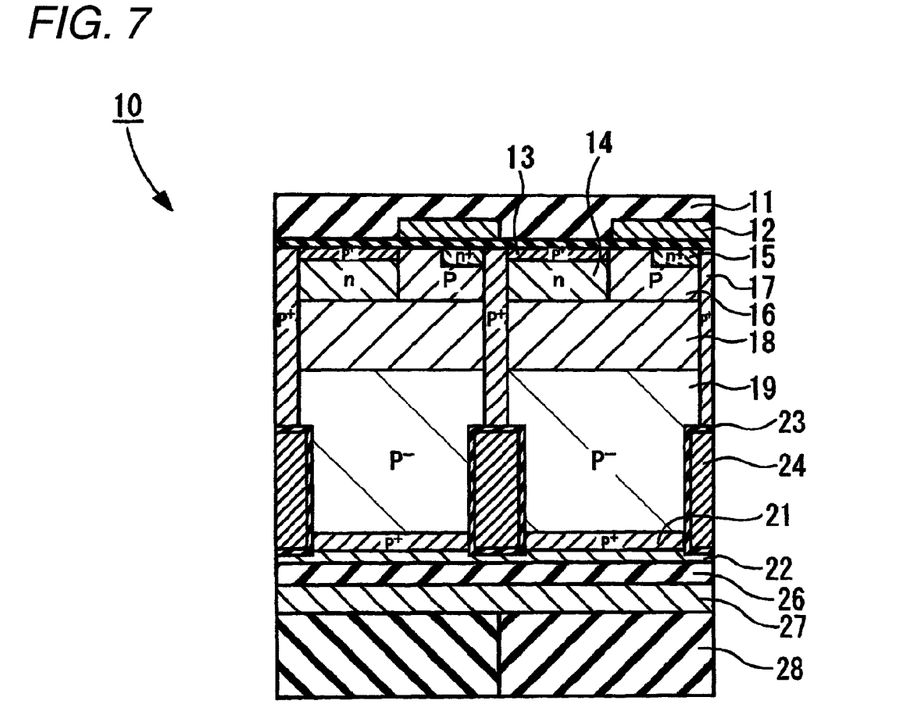
FIG. 7 is a section view showing the configuration of a third embodiment of the image pickup device of the invention.

FIG. 7 shows a third embodiment of the image pickup device of the invention. The image pickup device 10 of the embodiment has a configuration where the light blocking members 24 extend toward the surface side in the vertical direction (the upward and downward direction in FIG. 7) of the photoelectric converting layer. Specifically, the light blocking members 24 formed on the upper face of the silicon layer 22, and the insulating film 23 formed outside the light blocking members 24 are formed in a state where they extend toward the surface side of the photoelectric converting layer, surface-side end portions come into contact with or approach rear face-side end portions. According to the configuration, light which is incident on the photoelectric converting layer can be prevented by the light blocking members 24 from entering surrounding pixel regions, and occurrence of color mixture can be suppressed.

The present application claims foreign priority based on Japanese Patent Application (JP 2007-144816) filed May 31 of 2007, the contents of which is incorporated herein by reference.

What is claimed is:

1. An image pickup device comprising a semiconductor substrate that is irradiated with light from a first surface side thereof, and taking an image by reading signal charges generated in the semiconductor substrate in accordance with the light from a second surface side thereof,
wherein
the semiconductor substrate comprises:
a photoelectric converting layer that includes a plurality of impurity diffusion layers on the second surface side of the semiconductor substrate, and that produces the signal charges by photoelectric conversion; and
an embedded member that includes a light blocking material, and that is embedded in an impurity diffusion layer on a surface side of the photoelectric converting layer to which the light irradiated on the first surface side of the semiconductor substrate is entered.

2. The image pickup device as claimed in claim 1, wherein
the embedded member comprises a plurality of light blocking members that are placed in boundaries of adjacent pixels.

3. The image pickup device as claimed in claim 2, wherein
the photoelectric converting layer comprises a pixel separation region that is formed in the boundaries of the adjacent pixels, and
the light blocking members are formed adjoining the pixel separation region.

4. The image pickup device as claimed in claim 2, wherein
outer circumferences of the light blocking members are covered by an insulating material.

5. The image pickup device as claimed in claim 4, wherein
a negative voltage is applied to the light blocking members.

6. The image pickup device as claimed in claim 4, wherein
the insulating material comprises one of an insulating film that is formed by performing a heat treatment on a light blocking member made of a metal material, and a silicide oxide film of a metal material.

7. The image pickup device as claimed in claim 2, wherein
the light blocking members are covered by a non-depleted layer of the impurity diffusion layers.

8. The image pickup device as claimed in claim 7, wherein
the light blocking members are grounded.

9. The image pickup device as claimed in claim 1, wherein
the embedded member is formed in at least one of the first surface side and the second surface side of the semiconductor substrate, and includes an alignment mark that is used as a positional reference of an optical element to be disposed on the semiconductor substrate, during production of the image pickup device.

10. The image pickup device as claimed in claim 1, wherein
the semiconductor substrate comprises a color filter layer that includes a plurality of color filters transmitting light of different wavelengths, respectively, and that is formed on the first surface side thereof.

11. The image pickup device as claimed in claim 1, wherein
the semiconductor substrate comprises: an oxide film; and an antireflection film, the oxide film and the antireflection film being formed on the first surface side of the semiconductor substrate, and
one of the oxide film and the antireflection film comprises a light blocking film that is placed in boundaries of adjacent pixels outer circumference thereof.

12. The image pickup device as claimed in claim 1, having a ratio of a thickness of the photoelectric converting layer to a pixel size thereof, the ratio being 4 or more.

13. The image pickup device as claimed in claim 1, wherein
the pixel size is 2 µm square or less.

14. The image pickup device as claimed in claim 1, wherein
the photoelectric converting layer has a thickness of 8 µm or more.

15. A semiconductor substrate for an image pickup device comprising a semiconductor substrate that is irradiated with light from a first surface side thereof, and taking an image by reading signal charges generated in the semiconductor substrate in accordance with the light from a second surface side thereof,
the semiconductor substrate comprising:
a photoelectric converting layer that includes a plurality of impurity diffusion layers on the first surface side of the semiconductor substrate, and that produces the signal charges by photoelectric conversion; and
an embedded member that includes a light blocking material, and that is embedded in an impurity diffusion layer on a surface side of the photoelectric converting layer, the surface side facing the second surface side of the semiconductor substrate.

* * * * *